United States Patent
Hartensveld et al.

(10) Patent No.: US 12,015,105 B2
(45) Date of Patent: Jun. 18, 2024

(54) CAPACITIVE CONTROL OF ELECTROSTATIC FIELD EFFECT OPTOELECTRONIC DEVICE

(71) Applicants: Matthew Hartensveld, Wyckoff, NJ (US); Jing Zhang, Pittsford, NY (US)

(72) Inventors: Matthew Hartensveld, Wyckoff, NJ (US); Jing Zhang, Pittsford, NY (US)

(73) Assignee: Rochester Institute of Technology, Rochester, NY (US)

( * ) Notice: Subject to any disclaimer, the term of this patent is extended or adjusted under 35 U.S.C. 154(b) by 165 days.

(21) Appl. No.: 17/150,772

(22) Filed: Jan. 15, 2021

(65) Prior Publication Data
US 2021/0226087 A1 Jul. 22, 2021

Related U.S. Application Data

(60) Provisional application No. 62/961,815, filed on Jan. 16, 2020.

(51) Int. Cl.
*H01L 33/14* (2010.01)
*H01L 33/62* (2010.01)

(52) U.S. Cl.
CPC .............. *H01L 33/14* (2013.01); *H01L 33/62* (2013.01)

(58) Field of Classification Search
CPC ................................ H01L 33/14; H01L 33/62
See application file for complete search history.

(56) References Cited

U.S. PATENT DOCUMENTS

| | | |
|---|---|---|
| 3,946,591 A | 3/1976 | Yanagawa et al. |
| 6,040,590 A | 3/2000 | Obrien et al. |
| 6,885,036 B2 | 4/2005 | Tarsa et al. |
| 8,138,602 B2 | 3/2012 | Daubenspeck et al. |
| 8,344,398 B2 | 1/2013 | Parikh et al. |
| 8,431,943 B2 | 4/2013 | Nakamura et al. |
| 8,466,582 B2 | 6/2013 | Fornage |
| 8,557,616 B2 | 10/2013 | Lau et al. |
| 8,680,559 B2 | 3/2014 | Kim et al. |
| 9,171,883 B2 | 10/2015 | Chen et al. |
| 9,337,406 B2 | 5/2016 | Mn et al. |

(Continued)

FOREIGN PATENT DOCUMENTS

| | | |
|---|---|---|
| CN | 101388431 | 3/2009 |
| EP | 2212931 | 8/2010 |

(Continued)

OTHER PUBLICATIONS

Chao, S-H, et al, "Novel patterned sapphire substrates for enhancing the efficiency of GaN-based light-emitting diodes," RSC Advances, issue 28, 2020.

(Continued)

*Primary Examiner* — Feifei Yeung Lopez
(74) *Attorney, Agent, or Firm* — Bond, Schoeneck & King, PLLC

(57) ABSTRACT

A method and device for electrostatically controlling charges in an electrostatic field effect optoelectronic device by modulating charges in at least one layer of the electrostatic field effect optoelectronic device by providing either a positive bias or a negative bias to a capacitively coupled plate of the electrostatic field effect optoelectronic device thereby adjusting the charge utilization efficiency of the device.

10 Claims, 6 Drawing Sheets

(56) References Cited

U.S. PATENT DOCUMENTS

| | | | |
|---|---|---|---|
| 9,653,655 | B2 | 5/2017 | Thompson et al. |
| 9,978,911 | B2 | 5/2018 | Seong et al. |
| 2008/0296598 | A1 | 12/2008 | Wang et al. |
| 2010/0163911 | A1 | 7/2010 | Shum |
| 2011/0016872 | A1 | 1/2011 | Draper et al. |
| 2011/0168972 | A1 | 7/2011 | Kwak et al. |
| 2011/0244616 | A1 | 10/2011 | Yu et al. |
| 2011/0248300 | A1* | 10/2011 | Hwang .................. H01L 27/15 257/98 |
| 2012/0255601 | A1 | 10/2012 | Yoo |
| 2015/0187991 | A1 | 7/2015 | McGroddy et al. |
| 2018/0259570 | A1* | 9/2018 | Henley .................. H01L 33/36 |

FOREIGN PATENT DOCUMENTS

| | | |
|---|---|---|
| WO | 2009084325 | 7/2009 |
| WO | 2012093601 | 7/2012 |
| WO | 2015121054 | 8/2015 |
| WO | 2018063374 | 4/2018 |

OTHER PUBLICATIONS

Huang, H., "Improving modulation bandwidth and optical power of GaN-based blue LED by hollow-runway active area," Microwave and Optical Technology Letters, Feb. 14, 2020 (Abstract).

McCormick, C., "Improving Efficiency of Gallium-Nitride LEDs," Colorado College website https://www.coloradocollege.edu/academics/dept/physics/images/seminar/Callan.pdf (printed Jan. 15, 2021).

Lin, L., et al, "InGaN/GaN ultraviolet LED with a graphene/AZO transparent current spreading layer," Optical Materials Express, 2018.

Qi, C., et al, "Fabrication and characteristics of excellent current spreading GaN-based LED by using transparent electrode-insulator-semiconductor structure," Journal of Semiconductors, vol. 38, issue 8, 2017.

Kim, J. H., et al, "Effects of Current Spreading in GaN-based Light-emitting Diodes Using ITO Spreading Pad," Journal of Semiconductor Technology and Science, vol. 15 issue1, Feb. 2015.

International Search Report for International Patent Application PCT/US21/13695 (mailed May 20, 2021).

\* cited by examiner

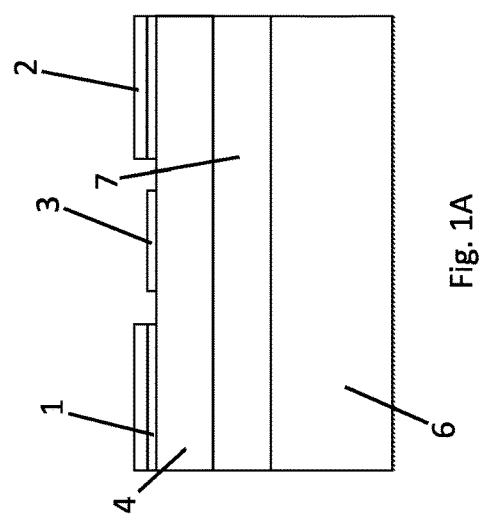
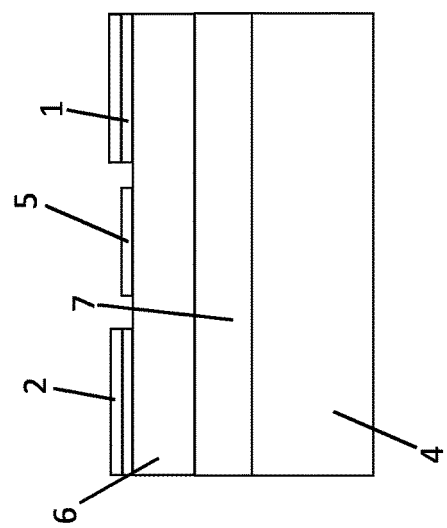
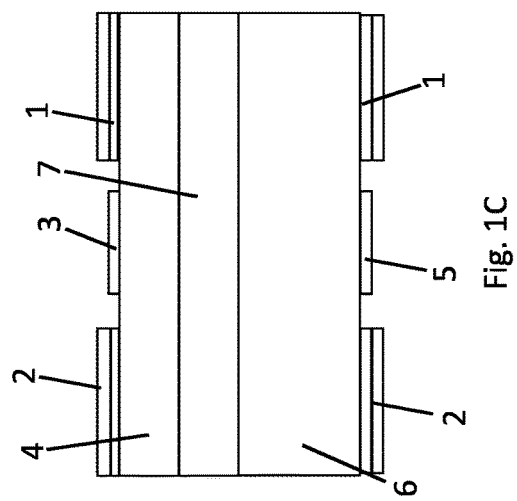

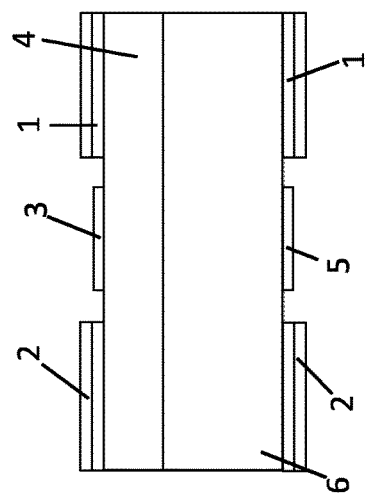
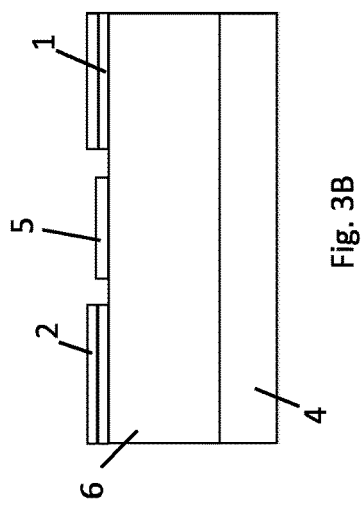
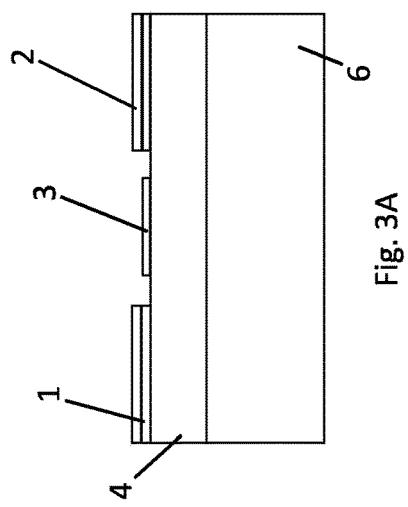

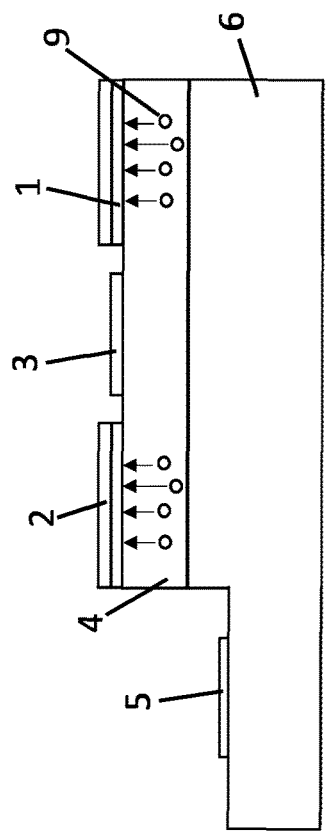
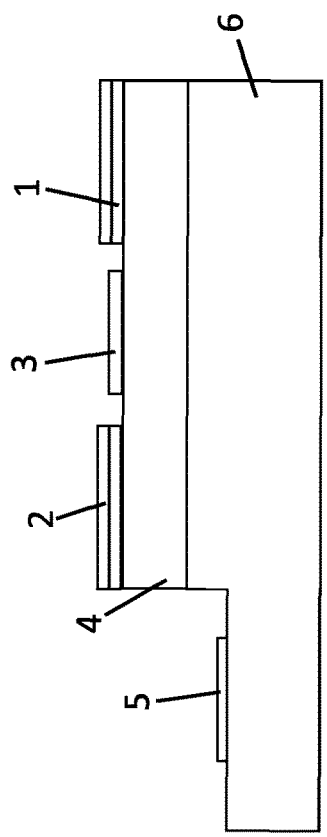
Fig. 4B
Fig. 4A

# CAPACITIVE CONTROL OF ELECTROSTATIC FIELD EFFECT OPTOELECTRONIC DEVICE

CROSS REFERENCE

This application claims the benefit of the filing date of U.S. Provisional Patent Application No. 62/961,815, filed Jan. 16, 2020, which is hereby incorporated by reference in its entirety.

FIELD

The present disclosure relates to methods and devices for capacitive control of an electrostatic filed effect optoelectronic device having a capacitively coupled plate, including light emitting diodes and solar cells.

BACKGROUND

Conventional Light Emitting Diodes (LEDs) suffer from poor p-type activation, meaning that LEDs are not as efficient as they could otherwise be. The poor p-type activation leads to added resistance which is a loss in performance for the device.

To previously address the poor p-type activation with the added resistance, various current spreading approaches have been applied. These approaches include putting a very thin transparent metal layer across the entire surface of the device or using a transparent conductive film, such as indium tin oxide (ITO), in order to enhance the limited charge utilization of the anode contact. The problems with these approaches are that thin metal layers or transparent conductive films directly on the surface suffer from high resistivity and lead to a voltage drop, limiting the potential LED improvements.

Solar cells operate through photon absorption, generating electron-hole pairs in the semiconductor, opposite in nature to LEDs. The subsequent collection and extraction of these electrons and holes to their n-type and p-type regions respectively can be a critical challenge. Engineering the depletion region can aid in carrier collection, though this can be difficult to implement for low-cost applications.

SUMMARY

In accordance with an aspect of the present disclosure, there is provided an electrostatic field effect optoelectronic device (EFEOED), including: a first doped layer; a second doped layer, an insulating layer adjacent the second doped layer, and a capacitively coupled plate adjacent the insulating later, wherein the first doped layer is a n-type doped layer and the second doped layer is a p-type doped layer or the first doped layer is a p-type doped layer and the second doped layer is a n-type doped layer.

In accordance with another aspect of the present disclosure, there is provided a method for electrostatically controlling charges in an EFEOED, including modulating charges in at least one layer of the EFEOED by providing either a positive bias or a negative bias to a capacitively coupled plate of the EFEOED thereby adjusting the charge utilization efficiency of the device.

In accordance with another aspect of the present disclosure, there is provided a method for electrostatically controlling charges in an EFEOED, wherein modulating the charges includes providing a negative bias on the capacitively coupled plate controlling a p-type layer of the electrostatic field effect optoelectronic device to increase the charge utilization efficiency of the device for current generation.

In accordance with another aspect of the present disclosure, there is provided a method for electrostatically controlling charges in an EFEOED, wherein modulating the charges includes providing a positive bias on the capacitively coupled plate controlling a n-type layer of the electrostatic field effect optoelectronic device to increase the charge utilization efficiency of the device for current generation.

In accordance with another aspect of the present disclosure, there is provided a method for electrostatically controlling charges in an EFEOED, wherein modulating the charges includes providing a positive bias on the capacitively coupled plate controlling a p-type layer of the electrostatic field effect optoelectronic device to decrease the charge utilization efficiency of the device for current generation.

In accordance with another aspect of the present disclosure, there is provided a method for electrostatically controlling charges in an EFEOED, wherein modulating the charges includes providing a negative bias on the capacitively coupled plate controlling a n-type layer of the electrostatic field effect optoelectronic device to decrease the charge utilization efficiency of the device for current generation.

In accordance with another aspect of the present disclosure, there is provided a method for electrostatically controlling charges in an EFEOED, wherein modulating the charges includes providing a negative bias on the capacitively coupled plate controlling a n-type layer of the electrostatic field effect optoelectronic device to increase the charge utilization efficiency of the device for light generation.

In accordance with another aspect of the present disclosure, there is provided a method for electrostatically controlling charges in an EFEOED, wherein modulating the charges includes providing a positive bias on the capacitively coupled plate controlling a p-type layer of the electrostatic field effect optoelectronic device to increase the charge utilization efficiency of the device for light generation.

In accordance with another aspect of the present disclosure, there is provided a method for electrostatically controlling charges in an EFEOED, wherein modulating the charges includes providing a positive bias on the capacitively coupled plate controlling a n-type layer of the electrostatic field effect optoelectronic device to decrease the charge utilization efficiency of the device for light generation.

In accordance with another aspect of the present disclosure, there is provided a method for electrostatically controlling charges in an EFEOED, wherein modulating the charges includes providing a negative bias on the capacitively coupled plate controlling a p-type layer of the electrostatic field effect optoelectronic device to decrease the charge utilization efficiency of the device for light generation.

These and other aspects of the present disclosure will become apparent upon a review of the following detailed description and the claims appended thereto.

BRIEF DESCRIPTION OF THE DRAWINGS

FIG. 1A is an embodiment where the EFEOED is an LED device in accordance with an embodiment of the present disclosure, FIG. 1B shows the device of FIG. 1A with interchanged n-type and p-type layers in accordance with an embodiment of the present disclosure, and FIG. 1C shows a capacitively coupled plate on both the p-type layer and n-type layer of a device in accordance with an embodiment of the present disclosure;

FIG. 3A is an embodiment where the EFEOED is a solar cell device in accordance with an embodiment of the present disclosure, FIG. 3B shows the device of FIG. 3A with interchanged n-type and p-type layers in accordance with an embodiment of the present disclosure, and FIG. 3C shows a capacitively coupled plate on both the p-type layer and n-type layer of a device in accordance with an embodiment of the present disclosure;

FIG. 4A is an embodiment where the EFEOED is a solar cell device in accordance with an embodiment of the present disclosure showing an n-type contact and p-type contact, and FIG. 4B shows the device of FIG. 4A operating with a negative bias on the capacitor plate to attract holes towards the surface for extraction;

DETAILED DESCRIPTION

Figure 2A:
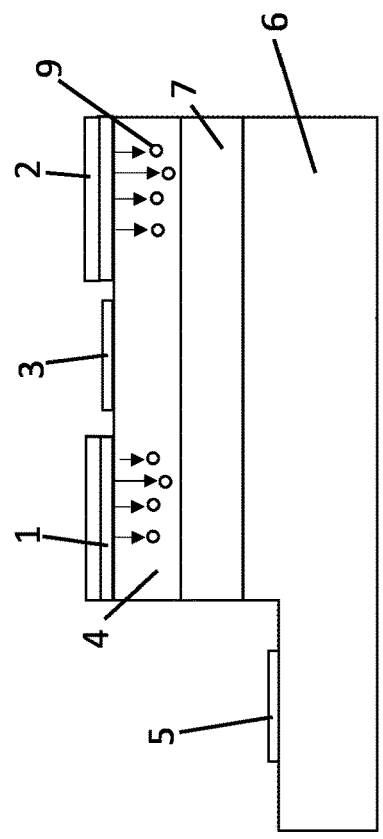
FIG. 2A is an embodiment where the EFEOED is an LED device in accordance with an embodiment of the present disclosure showing an n-type contact and p-type contact.

An embodiment of an electrostatic field effect optoelectronic device (EFEOED) includes a first doped layer; a second doped layer; an insulating layer adjacent the second doped layer, and a capacitively coupled plate adjacent the insulating layer.

In an embodiment the first doped layer is a n-type doped layer and the second doped layer is a p-type doped layer or the first doped layer is a p-type doped layer and the second doped layer is a n-type doped layer.

The function of the capacitively coupled plate adjacent to the insulating layer modulates the electrons or holes in the underlying doped layer of the EFEOED, to either attract or repel charges. In an embodiment where the device is an LED, the capacitively coupled plate repels the dominant charge carriers in the underlying doped layer to lead to increased charge recombination and subsequent light emission. In an embodiment where the device is a solar cell, the capacitively coupled plate simultaneously repels the minority charge carriers and attracts the majority charge carriers to aid in charge separation, and subsequent current generation. In both such embodiments the capacitively coupled plate can be biased accordingly to do the opposite, which allows for charge carrier control to purposely decrease the light generation or current output, respectively.

The capacitively coupled plate allows for control in that the intensity of either charge attraction or repulsion can be modulated depending on the magnitude of the applied voltage bias to the capacitively coupled plate. The voltage applied to the capacitively coupled plate creates an electric field through the insulating layer into the underlying doped layer such that charges are modulated.

A suitable insulating layer is thick enough to block current flow and has an energy band alignment with respect to a semiconductor layer of the EFEOED such that charge trap transport, direct tunneling, thermionic emission, and/or thermionic field emission current is negligible to the total drive current of the EFEOED. The bias applied to the capacitor plate and any current through the insulating layer is negligible in that the current-voltage performance of the anode and cathode should not be negatively impacted when the capacitor plate is grounded. The insulating layer, by the nature, is optically transparent and can be composed of a combination of several materials, including stacks of different dielectrics. By way of example, suitable insulators such as $Al_2O_3$, $SiO_2$, $Si_3N_4$, $Ga_2O_3$, $TiO_2$, and $HfO_2$ can be utilized.

The n-type doped layer is defined to be a region where free electron concentration dominates. The free electron concentration can be provided by donor atoms, which once incorporated into the lattice, provide an extra electron. An extra electron can also be provided by native defects to the material, such as vacancies. The electron acts as a single negative mobile charge. This extra electron can be freed with thermal energy and be used in current conduction in the device.

The p-type doped layer is defined to be a region where free hole concentration dominates. The free hole concentration can be provided by acceptor atoms, which once incorporated into the lattice, provide a lack of an electron, i.e., a hole. An extra hole can also be provided by native defects to the material such as vacancies. The hole acts as a single positive mobile charge. This extra hole can be freed with thermal energy and be used in current conduction in the device.

Examples of semiconductor doped layer materials include, but are not limited to, Si, GaN, GaAs, AlGaN, AlGaAs, InP, InAs, and InGaN.

An LED is defined as a light emission device, where electrons and holes recombine in order to emit light. The most basic structure includes n-type and p-type layers, where a MQW region exists in-between the n-type and p-type layer to aid in electron-hole recombination. The basic structure can be built upon to include different layers or replace certain layers, though provide the same fundamental device operation.

A solar cell is defined as a light absorbing device, where electrons and holes are generated and utilized in order to cause current flow. The most basic structure includes n-type and p-type layers. The basic structure can be built upon to include different layers or replace certain layers, though provide the same fundamental device operation.

An embodiment of a method for electrostatically controlling charges in an EFEOED, includes modulating charges in at least one layer of the EFEOED by providing either a positive bias or a negative bias to the capacitively coupled layer of the EFEOED device thereby adjusting the charge utilization efficiency of the device. Where charge modulation involves the electrostatic principals of charge repulsion or attraction through energy band bending, depending on the charge type and applied bias to a capacitor plate.

Figure 2B:
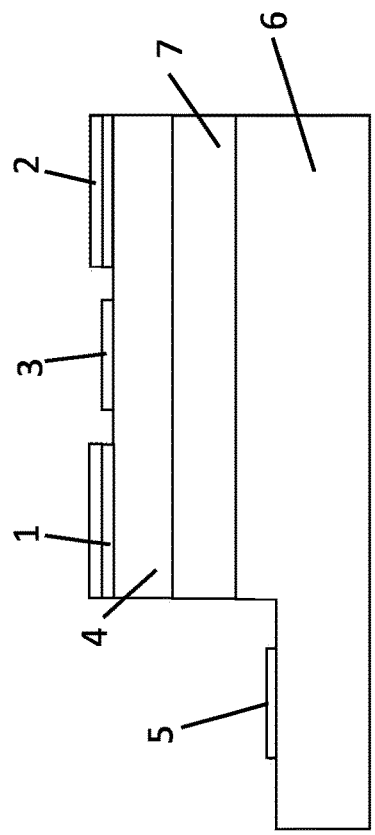
FIG. 2B shows the device of FIG. 2A with a positive bias applied to the capacitor plate which repels holes towards the multiple quantum well (MQW) region.
Figures 5A, 5B, 5C, 5D:
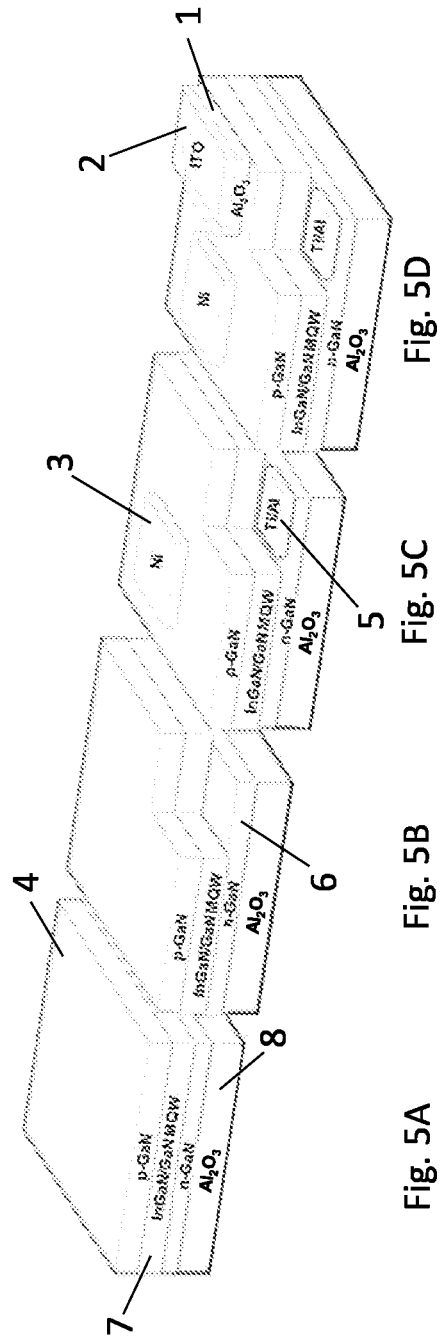
FIG. 5A shows an initial step of a fabrication sequence for a 3-layer EFEOED LED on a substrate in accordance with the present invention.
FIG. 5B shows etching of a portion of the top two layers of the device.
FIG. 5C shows deposition and patterning of contacts on the n-type and p-type layers.
FIG. 5D shows deposition and patterning of an insulating dielectric and top plate.

In an embodiment where the EFEOED is an LED and the capacitive coupling is to the p-type layer 4, a positive bias to the capacitor plate will repel holes towards the MQW region 7 to recombine with electrons, increasing light generation, FIG. 2B. Conversely, in the same embodiment a negative bias to the capacitor plate 2 would attract holes towards the insulating layer 1, limiting electron-hole recombination and decreasing light generation.

In an embodiment where the EFEOED is a solar cell and the capacitive coupling is to the p-type layer 4, a negative bias to the capacitor plate 2 will attract holes towards the insulating layer 1 to aid in current extraction from the p-type contact 3, FIG. 4B. Conversely, in the same embodiment a positive bias to the capacitor plate 2 would repel holes from the insulating layer 1, limiting hole extraction.

Comparing embodiments where the EFEOED is an LED or a solar cell with the capacitive coupling to the same doped layer, the enhancement of device efficiency is obtained through opposite polarities of the bias applied to the capacitor plate. A solar cell behaves inverse to an LED in that electrons and holes are generated and extracted to their respective layers, as compared to recombining to produce light.

The charge repulsion or attraction provided by the capacitor plate allows for additional charges to participate in current or light generation over conventional solar cells or LEDs. In conventional devices the cathode and anode are only able to locally utilize electrons or holes, leaving many charges in the doped layer underutilized. By integrating a capacitively coupled plate in areas not occupied by the anode or cathode, an electric field can be introduced in order to modulate these charges.

In an embodiment where the EFEOED is an LED, the structure can be composed of the following: capacitor plate 2, insulating layer 1, p-type layer 4, MQW layer 7, and n-type layer 6, as shown in FIG. 2A. Additional layers can be added or replaced, though EFEOED provides enhanced charge utilization for greater electron-hole recombination.

In an embodiment where the EFEOED is a solar cell, the structure can be composed of the following: capacitor plate 2, insulating layer 1, p-type layer 4, n-type layer 6 as shown in FIG. 4A. Additional layers can be incorporated or replaced, though the EFEOED provides enhanced charge utilization for absorbed photons.

FIG. 1A illustrates an embodiment where the EFEOED is an LED including p-type contact 3, n-type doped layer 6, p-type doped layer 4, MQW region 7, capacitor plate 2 and insulating material 1 between the capacitor plate 2 and the p-type layer 4. Increased efficiency, as defined by light output at a given current input, can be accomplished by placing a positive charge on the capacitor plate 2 producing an electric field in the p-type layer 4 such that holes are repelled from the surface towards the MQW region 7. Application of a negative charge to the capacitor plate 2 produces an opposite electric field, which attracts holes to the surface, decreasing electron-hole recombination in the MQW region 7 and correspondingly decreasing efficiency.

FIG. 1B illustrates an embodiment where the EFEOED is an LED including n-type contact 5, n-type doped layer 6, p-type doped layer 4, MQW region 7, capacitor plate 2 and insulating material 1 between the capacitor plate 2 and the n-type doped layer 6. Increased efficiency, as defined by light output at a given current input, can be accomplished by placing a negative charge on the capacitor plate 2 producing an electric field in the semiconductor such that electrons are repelled from the surface towards the MQW region 7, increasing efficiency. Application of a positive charge to the capacitor plate 2 produces an opposite electric field, which attracts electrons to the surface, decreasing electron-hole recombination in the MQW region 7 and correspondingly decreasing efficiency.

FIG. 1C illustrates an embodiment where the EFEOED is an LED including n-type contact 5, p-type contact 3, n-type doped layer 6, p-type doped layer 4, MQW region 7, capacitor plate 2, and insulating material 1. Increased efficiency, as defined by light output at a given current input, can be accomplished by placing a negative charge on the capacitor plate 2 that shares insulating material 1 with the n-type layer 6 and a positive charge is placed on the capacitor plate 2 that shares insulating material 1 with the p-type layer 4. The capacitor plates produce electric fields such that electrons and holes are driven to the MQW region 7. For decreased efficiency, as defined by less light output at a given current input, a positive charge is placed on the capacitor plate 2 that shares an insulating layer with the n-type layer 6 and a negative charge is placed on the capacitor plate 2 that shares an insulating layer with the p-type layer 4. The capacitor plates produce electric fields such that electrons and holes are driven away from the MQW region 7.

FIG. 2A illustrates an embodiment where the EFEOED is an LED including p-type contact 3, n-type contact 5, n-type doped layer 6, p-type doped layer 4, MQW region 7, capacitor plate 2 and insulating material 1 between the capacitor plate 2 and the p-type layer 4.

FIG. 2B illustrates an embodiment where the EFEOED is an LED including p-type contact 3, n-type contact 5, n-type doped layer 6, p-type doped layer 4, MQW region 7, capacitor plate 2 and insulating material 1 between the capacitor plate 2 and the p-type layer 4. A positive bias is applied to the capacitor plate 2, repelling holes 9 towards the MQW region 7, enhancing electron-hole recombination.

FIG. 3A illustrates an embodiment where the EFEOED is a solar cell including n-type doped layer 6, p-type contact 3, p-type doped layer 4, capacitor plate 2 and insulating material 1 between the capacitor plate 2 and p-type doped layer 4. Increased solar cell efficiency, defined by light input to current output, can be accomplished by placing a negative charge on the capacitor plate 2 producing an electric field in the semiconductor such that holes are attracted to the surface and electrons are repelled. Application of a negative charge to the capacitor plate 2 produces an opposite electric field, which repels holes from the surface and attracts electrons to the surface, correspondingly decreasing efficiency.

FIG. 3B illustrates an embodiment where the EFEOED is a solar cell including n-type doped layer 6, p-type doped layer 4, n-type contact 5, capacitor plate 2 and insulating material 1 between the capacitor plate 2 and n-type doped layer 6. Increased solar cell efficiency, defined by light input to current output, can be accomplished by placing a positive charge on the capacitor plate 2 producing an electric field in the semiconductor such that electrons are attracted, and holes are repelled from the surface. Application of a negative charge to the capacitor plate 2 produces an opposite electric field, which repels electrons from the surface and holes are attracted, correspondingly decreasing efficiency.

FIG. 3C illustrates an embodiment where the EFEOED is a solar cell including n-type contact 5, p-type contact 3, n-type doped layer 6, p-type doped layer 4, capacitor plate 2, and insulating material. Increased efficiency, defined by increased current at a given illumination, can be accomplished by placing a positive charge on the capacitor plate 2 that shares insulating material 1 with the n-type layer 6 and a negative charge is placed on the capacitor plate 2 that shares insulating material 1 with the p-type layer 4. The capacitors produce electric fields such that electrons and holes are driven to the n-type region 6 and p-type region 4, respectively. Decreased efficiency, as defined by current output at a given illumination, can be accomplished by placing a negative charge on the capacitor plate 2 that shares an insulating layer with the n-type layer 6 and a positive charge is placed on the capacitor plate 2 that shares an insulating layer with the p-type layer 4. The capacitors produce electric fields such that electrons and holes are driven away from the surfaces.

FIG. 4A illustrates an embodiment where the EFEOED is a solar cell including n-type doped layer 6, p-type contact 3, n-type contact 5, p-type doped layer 4, capacitor plate 2 and insulating material 1 between the capacitor plate 2 and the p-type doped layer 4. Increased solar cell efficiency, defined by light input to current output, can be accomplished by placing a negative charge on the capacitor plate 2 producing an electric field in the semiconductor such that holes are attracted to the surface and electrons are repelled. Application of a positive charge to the capacitor plate 2 produces an opposite electric field, which repels holes from the surface and attracts electrons to the surface, correspondingly decreasing efficiency.

FIG. 4B illustrates an embodiment where the EFEOED is a solar cell includes p-type contact 3, n-type contact 5, n-type doped layer 6, p-type doped layer 4, capacitor plate 2 and insulating material 1 between the capacitor plate 2 and p-type doped layer 4. A negative bias is applied to the capacitor plate 2, attracting the dominant charge carrier holes 9 towards the insulating layer 1, enhancing current extraction.

FIGS. 5A-D illustrate a fabrication process of an embodiment of an EFEOED, where the EFEOED is an LED. The n-type layer 6, MQW region 7, and p-type layer 4 are grown on a sapphire substrate 8. The layers are selectively etched to reveal the n-type layer 6. The n-type contact 5 is formed on the n-type layer 6, and the p-type contact 3 is formed on the p-type layer 4. An insulating layer 1 of $Al_2O_3$ is deposited through atomic layer deposition, followed by the sputtered deposition of ITO to form the capacitor plate 2. Both materials are patterned together with a single etch step, to create the defined capacitor plate 2 on top the p-type layer 4.

Figure 6C:
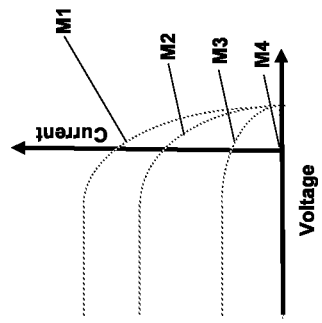
FIG. 6C is a graph showing current output levels where the device is a solar cell in accordance with an embodiment of the present disclosure.
Figure 6B:
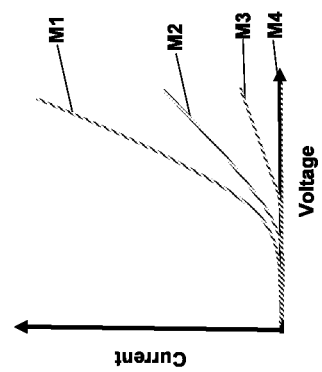
FIG. 6B is a graph showing current output levels for a given anode bias in accordance with an embodiment of the present disclosure.
Figure 6A:
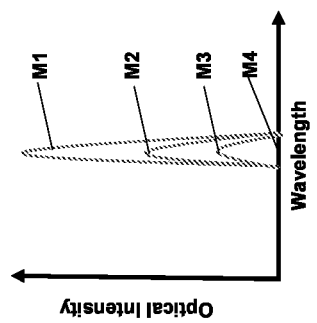
FIG. 6A is a graph showing modulation of light output levels where the device is an LED at a given anode bias.

FIG. 6A is a graph illustrating the light output of an EFEOED, where the EFEOED is an LED. A bias applied to the capacitor plate 2 modulates the light output, creating different light intensity levels M1-M4 for a fixed anode, p-type contact 3 and cathode, n-type contact 6 bias of the structure of FIG. 1C. The capacitor bias controls injection of electrons and holes from the respective n-type layer 6 and p-type layer 4 into the MQW region 7.

FIG. 6B is a graph illustrating the current output of an EFEOED, where the EFEOED is a diode in forward bias. The current vs. voltage characteristics are shown, where the current is recorded as the anode, p-type contact 3, bias is increased with respect to the cathode, n-type contact 5, of the structures in FIGS. 1C and 3C. A bias to the capacitor plate 2 modifies the characteristics, increasing or decreasing current at a given anode bias, creating curves M1-M4. The capacitor bias controls injection of electrons and holes from the respective n-type layer 6 and p-type layer 4.

FIG. 6C is a graph illustrating the current output vs. voltage characteristics of an EFEOED, where the EFEOED is a solar cell with constant illumination. A bias to the capacitor plate modifies the characteristics, increasing or decreasing current extraction at a given anode bias, creating curves M1-M4. The capacitor bias controls collection of electrons or holes the respective n-type layer 6 and p-type layer 4, structurally shown in FIG. 3C.

In an embodiment, the EFEOED has a p-type contact 3 connected to the same shared p-type layer 4 with the capacitor plate 2, FIG. 1A and FIG. 3A. The p-type contact 3 serves as the anode and is utilized in order to facilitate connection with external circuitry to supply voltage and current to the EFEOED. The p-type contact 3 creates a localized electric field such that charges nearby are attracted or repelled, while acting as the source or sink of holes. Many different designs and materials can be used for the contact. These conductive contacts can be deposited using standard semiconductor techniques such as, but not limited to, thermal evaporator, sputtering, chemical vapor deposition, e-beam evaporator, and atomic layer deposition. The p-type contact 3 has the function of modulating the energy bands such that the flow of carrier can be promoted or restricted.

In an embodiment, the EFEOED has a n-type contact 5 connected to the n-type layer 6 shared with the capacitor plate 2, FIG. 1B and FIG. 3B. The n-type contact 5 serves as the cathode and is utilized in order to facilitate connection with external circuitry to supply voltage and current to the EFEOED. The n-type contact 5 creates a localized electric field such that charges nearby are attracted or repelled, while acting as the source or sink of electrons. Many different designs and materials can be used for the contact. These conductive contacts can be deposited using standard semiconductor techniques such as, but not limited to, thermal evaporator, sputtering, chemical vapor deposition, e-beam evaporator, and atomic layer deposition. The n-type contact 5 has the function of modulating the energy bands such that the flow of carrier can be promoted or restricted.

In an embodiment, the device has both a p-type contact 3 connected to the p-type layer 4 and a n-type contact 5 connected the n-type layer 6, FIGS. 1C and 3C. The design and position of the p-type contact 3 and n-type contact 5 can be modified in order to increase total efficiency of the EFEOED, where the EFEOED is a diode, solar cell, and/or LED.

For an embodiment where the EFEOED is an LED and the capacitor plate 2 is integrated with the p-type layer 4, the device with n-type contact 5 and p-type contact 3 is shown by FIGS. 2A-B. A positive bias applied to the capacitor plate 2 is illustrated in FIG. 2B, showing the repulsion of holes 9 from the surface due to the electric field from the capacitor plate 2. The holes 9 will recombine in the MQW region 7 with electrons and be resupplied with holes 9 from the anode, p-type contact 3. The positions of the holes 9 relative to the anode, p-type contact 3, is such that they would not be utilized due to the localized field provided by just the anode, p-type contact 3. Use of the capacitive coupling from a bias to the capacitor plate 2, allows for greater charge utilization, where now the holes participate in electron-hole recombination, increasing efficiency.

For an embodiment where the EFEOED is a solar cell and the capacitor plate 2 is integrated with the p-type layer 4, the complete device with n-type contact 5 and p-type contact 3 is shown by FIGS. 4A-B. A negative bias applied to the capacitor plate 2 is illustrated in FIG. 4B, showing the attraction of holes 9 towards the surface due to the electric field from the capacitor plate 2. These excess holes 9 generated through light absorption will be extracted out of the device through the anode, p-type contact 3. The positions of the holes 9 relative to the anode, p-type contact 3, is such that they would not be utilized due to the localized field provided by just the anode, p-type contact 3. Use of the capacitive coupling from a bias to the capacitor plate 2, allows for greater charge utilization, where now the holes 9 participate in current extraction, increasing efficiency.

A bulk substrate 8 can act as an active layer to the EFEOED in an embodiment. In another embodiment, the substrate 8 acts as a mechanical supporting layer but is not an active layer in the EFEOED device. The material system and integration method dictate such utilization of the substrate. Such an embodiment might utilize a Si substrate to act as both the mechanical support and as an active layer of the device i.e., n-type doped layer 6, with a p-type doped layer 4 formed on top. This design allows for alternative contact arrangement such as backside contacts. Another embodiment may make use of the GaN materials system for an LED, though conventionally the layers are grown on an insulating sapphire substrate, necessitating the use of two top-side contacts, FIGS. 5C-D.

In an embodiment the capacitor plate can be optically reflective in order to reflect light in the EFEOED.

In an embodiment the capacitor plate can be optically transparent to allow the transmission of light. Examples include, but are not limited to, thin layer of metal or transparent conductors such as ITO.

By the choice of both insulating layer and capacitor plate, greater light transmission can be achieved, further enhancing the performance of the device. Conventional semiconductors have a high index of refraction compared with air, hampering light emission or absorption. The insulting layer can be chosen such that the refractive index can be partially graded to enhance light emission or absorption, where the refractive index is between that of the semiconductor and air. The capacitor plate can potentially be selected with a lower refractive index than the insulating layer or be engineered thin enough as to not entirely inhibit the light extraction benefits of the insulating layer.

The capacitor plate formed on the EFEOED can be fabricated to occupy a different amount of the p-type doped layer 4 and/or n-type doped layer 6 surface. The capacitor can also be formed into a variety of designs, by way of example, a star, a circle, a box, or a grid. Preferably, capacitor induced control is obtained where the capacitor is formed in areas not occupied by the n-type contact 5 or p-type contact 3.

In an embodiment, where the EFEOED is an LED, the impact the carrier modulation on light output can be seen in FIG. 6A, where the p-type contact 3 and n-type contact 5 of the LED are at a fixed voltage, and the voltage on the capacitor plate 2 is varied.

In an embodiment, where the EFEOED is a diode, the impact of the carrier modulation on current, and corresponding resistance, of a forward biased diode where the p-type contact 3 voltage is increased with respect to the n-type contact 5 of the diode, are shown in FIG. 6B. For each curve in FIG. 6B, the capacitor plate 2 is set at a fixed voltage for each voltage sweep of the p-type contact, creating carrier modulation that independently modified the output current.

In an embodiment, where the EFEOED is a solar cell, the impact of the carrier modulation on generated current of a reverse biased diode where the p-type contact 3 voltage is decreased with respect to the n-type contact 5 of the diode, are shown in FIG. 6C. For each curve in FIG. 6C, the capacitor plate 2 is set at a fixed voltage for each voltage sweep of the p-type contact, with constant illumination in each case, creating carrier modulation that independently modified the generated current.

The advantages over previous technology are that this technique combines Metal Oxide Semiconductor (MOS) technology and control through integration with one or more of the device layers, where charge modulation can be achieved, through an easy to integrate approach. The EFEOED provides control, while introducing increased performance. Whether the EFEOED is a LED or solar cell, the internal structural design is flexible and can be modified to achieve high efficiency.

The disclosure has illustrated with reference to specific examples. It is understood that these examples are given by way of illustration and are not meant to limit the disclosure or the claims to follow.

EXAMPLE 1—is an EFEOED, where the EFEOED is an LED, has been fabricated. The structure contains an n-type layer, MQW region, and p-type layer, on a sapphire substrate. The emission is engineered at 450 nm. A chlorine based reactive ion etch is performed with a photoresist mask in order to selectively uncover the n-type layer. The p-type contact is deposited in a half star structure on the p-type layer, where the contact is Ni/Au. The n-type contact is deposited in a bar shape on the n-type layer, where the metal is Ti/Au. 30 nm of $Al_2O_3$ is deposited through atomic layer deposition, followed by low power sputtering of 70 nm of ITO, forming the insulating layer and capacitor plate, respectively. Photoresist masks a single buffered oxide wet etch, patterning the $Al_2O_3$ and ITO, leaving the capacitor over half of the p-type layer. Electroluminescence results were recorded, showing capacitor control over light output with an over 115% increase in total efficiency with a 5 V capacitor bias, and a 14% decrease in efficiency with −5 V capacitor bias, while the anode is flowing a current of 50 µA. Light extraction efficiency was enhanced by 6% over a classical LED, with a pathway for higher enhancement demonstrated with a thinner ITO top capacitor plate.

EXAMPLE 2—is an EFEOED, where the EFEOED is an LED, has been fabricated for emission at 267 nm. AlN is grown on a sapphire substrate followed an n-type layer of AlGaN, an AlGaN MQW region, a p-type layer of AlGaN, and a p-type layer of GaN. Photoresist patterning is performed, utilizing the resist as a mask to selectively etch the LED to reveal the buried n-type layer of AlGaN. The contacts are formed through e-beam evaporation, where the n-type contact is Ti/Al/Ni/Ag and the p-type contact is Ni. 50 nm of $Al_2O_3$ are deposited through atomic layer deposition for the insulating layer, followed by the selective thermal evaporator of 7 nm of Ni for the capacitor plate. A thicker Ni layer is selectively deposited over a small portion of the thin Ni to act as a support for an electrical contact for the capacitor plate. The thin Ni acts as the charge plate, while providing high optical transparency, where alternatives like ITO would highly absorb the emitted light. The selectively deposited thin Ni acts as the hard mask for a buffered oxide etch, which removes the $Al_2O_3$ everywhere but under the thin Ni. Different capacitor designs were fabricated, finding larger capacitors provided better LED efficiency improvements, with the p-type contact position at the center finding additional importance. Electroluminescence results were collected, finding the capacitor controlled the electroluminescence intensity, where the peak could be boosted by 172% or reduced by 38% given a positive or negative 20 V bias applied to the capacitor plate, respectively. Increased efficiency of up to 42% was recorded for these LEDs, operating at a current of 1 mA and applying 20 V to the capacitor plate. The novelty of the work is therefore expected that large gains in efficiency can be obtained by integration with alternative LEDs or other OED structures.

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A method for electrostatically controlling charges in an electrostatic field effect optoelectronic device, comprising:
   applying a voltage between an electrical contact of a first doped layer and an electrical contact of a second doped layer of the electrostatic field effect optoelectronic device while
   providing either a fixed positive bias or a fixed negative bias to a capacitively coupled plate of the electrostatic field effect optoelectronic device thereby adjusting the charge utilization efficiency of the device.

2. The method of claim 1, wherein adjusting the charge utilization efficiency of the device comprises increasing the efficiency of the device.

3. The method of claim 1, wherein adjusting the charge utilization efficiency of the device comprises decreasing the efficiency of the device.

4. The method of claim 1, wherein the electrostatic field effect optoelectronic device further comprises an MQW region between the first doped layer and the second doped layer.

5. The method of claim 4, wherein adjusting the charge utilization efficiency of the device comprises increasing the efficiency of the device.

6. The method of claim 4, wherein adjusting the charge utilization efficiency of the device comprises decreasing the efficiency of the device.

7. The method of claim 1, wherein the electrostatic field effect optoelectronic device comprises:
   an insulating layer adjacent to and in direct contact with the second doped layer, wherein the second doped layer is between the first doped layer and the insulating layer, wherein the first doped layer and the second doped layer are not in direct contact with a common insulating layer; and
   a capacitively coupled plate adjacent to and in direct contact with the insulating layer, wherein the first doped layer is n-type doped and the second doped layer is p-type doped or the first doped layer is p-type doped and the second doped layer is n-type doped.

8. The method of claim 7, wherein the device further comprises a p-type contact adjacent the p-type doped layer.

9. The method of claim 7, wherein the device further comprises a n-type contact adjacent the n-type doped layer.

10. The method of claim 7, wherein the device further comprises a p-type contact adjacent the p-type doped layer and a n-type contact adjacent the n-type doped layer.

* * * * *